United States Patent [19]

Kawai et al.

[11] Patent Number: 5,680,050
[45] Date of Patent: Oct. 21, 1997

[54] BATTERY CONDITION DETECTION METHOD

[75] Inventors: Toshiyuki Kawai, Toyohashi; Daisuke Makino, Ichinomiya; Mitsunobu Uchida, Okazaki; Hidetoshi Kato, Suzuka; Torahiko Sasaki, Mishima, all of Japan

[73] Assignees: Nippondenso Co., Ltd., Aichi; Nippon Soken Inc.; Toyota Jidosha Kabushiki Kaisha, both of Aichi-ken, all of Japan

[21] Appl. No.: 400,082

[22] Filed: Mar. 7, 1995

[30] Foreign Application Priority Data

Mar. 7, 1994 [JP] Japan ................ 6-064695
Apr. 27, 1994 [JP] Japan ................ 6-112202

[51] Int. Cl.$^6$ ................ G01R 27/26
[52] U.S. Cl. ................ 324/427; 320/48
[58] Field of Search ................ 324/427, 428; 320/48; 340/636

[56] References Cited

U.S. PATENT DOCUMENTS

| | | | |
|---|---|---|---|
| 4,180,770 | 12/1979 | Eby | 324/429 |
| 4,558,281 | 12/1985 | Codd et al. | 324/427 |
| 4,595,880 | 6/1986 | Patil | 324/427 |
| 4,740,754 | 4/1988 | Finger | 324/428 |
| 4,876,513 | 10/1989 | Brilmeyer | 324/427 |
| 4,931,737 | 6/1990 | Hishiki | 324/428 |
| 5,352,982 | 10/1994 | Nakazawa et al. | 324/427 |
| 5,394,089 | 2/1995 | Clegg | 324/427 |
| 5,403,093 | 4/1995 | Flynn, Jr. et al. | 324/427 |
| 5,434,495 | 7/1995 | Toko | 324/427 |
| 5,444,378 | 8/1995 | Rogers | 324/428 |

FOREIGN PATENT DOCUMENTS

| | | |
|---|---|---|
| 52-79234 | 7/1977 | Japan . |
| 56-28476 | 3/1981 | Japan . |
| 61-93967 | 5/1986 | Japan . |
| 62-175678 | 8/1987 | Japan . |
| 63-157078 | 6/1988 | Japan . |
| 63-08773 | 8/1988 | Japan . |
| 2247588 | 10/1990 | Japan . |
| 634727 | 2/1994 | Japan . |
| 659003 | 3/1994 | Japan . |

OTHER PUBLICATIONS

"Test and Evaluation of the Technical University of Aachen Range Prediction Device for Electric Vehicles" by J. H. Barnett et al; Jan. 1987.

*Primary Examiner*—Maura K. Regan
*Attorney, Agent, or Firm*—Cushman Darby & Cushman IP Group of Pillsbury Madison & Sutro LLP

[57] ABSTRACT

A battery condition detecting method is provided which includes the steps of setting a current required during standard discharge of a battery as a set current, detecting a discharge current and a voltage of the battery, determining a battery voltage when the battery discharge the set current based on the discharge current and the voltage of the battery, and projecting an actual voltage of the battery based on the battery-voltage determined.

9 Claims, 10 Drawing Sheets

CONSTANT CURRENT DISCHARGE
CHARACTERISTIC

Qd : THE AMOUNT OF DISCHARGE
Qc : THE AMOUNT OF CHARGE

BATTERY CONDITION DETECTION METHOD

BACKGROUND OF THE INVENTION

1. Technical Field

The present invention relates generally to a method for determining conditions of a storage battery and more particularly to an improved method for determining the amount of available reserve electric power remaining in an automotive storage battery to know a time when the battery should be recharged.

2. Background Art

An available capacity remaining in a battery is usually expressed in ampere-hours (AH), and determined by, for example measuring current and voltage during discharge and looking up given data provided based on the measured current and voltage.

Japanese Patent First Publication No. 52-79234 teaches a simple battery capacity determining method utilizing a voltage level detected when a given battery current value is reached.

Generally, in storage batteries installed in vehicles, and especially, those employed as power sources of electric vehicles, a discharged current and a battery voltage during vehicle traveling are frequently varied. The variation in the battery voltage, as shown in FIGS. 3(a) and 3(b), undergoes a delay following an abrupt variation in the discharged current. Thus when a battery voltage is measured immediately after change in current, it will contain an error. This is because the specific gravity of electrolyte initially experiences a great reduction near electrodes, and then decreases wholly as a function of time.

Additionally, in an electric vehicle, the battery is recharged every time the vehicle is braked, leading to charge polarization of the battery. This will cause a battery voltage to be changed more than a normal. It, therefore, becomes difficult to determine a battery voltage correctly.

Further, continuous discharge of the battery also induces discharge polarization. This, as shown in FIG. 4, causes battery consumption (AH) to be changed dependent upon an average current discharged so far if a battery voltage during discharge at a given rates (e.g., 200A) remains unchanged. Specifically, as the average discharged current increases, the battery consumption at a constant voltage, as shown by lines x, y, and z, tends to be decreased. Therefore, when the battery is discharged continuously with a great change in discharged current, it is difficult to determine a remaining battery capacity based on the battery voltage during discharge at a given rate (e.g., 200A).

The above phenomenon may be explained using a discharge characteristic of a constant current shown in FIG. 5. As can be seen in the graph, as an average discharge current is increased, a voltage drop, as shown by lines x, y, z, is developed earlier so that an available discharge duration is shortened, resulting in decreased available discharge capacity (discharge current×discharge duration). Thus, in this case, a remaining battery capacity cannot be used to accurately determine battery conditions.

SUMMARY OF THE INVENTION

It is therefore a principal object of the present invention to avoid the disadvantages of the prior art.

It is another object of the present invention to provide an improved method for correctly determining the amount of available reserve electric power remaining in an automotive storage battery.

According to one aspect of the present invention, there is provided a battery condition detecting method which comprises the steps of: setting a current required during standard discharge of a battery as a set current; detecting a discharge current and a voltage of the battery; determining a battery voltage when the battery discharges the set current based on the discharge current and the voltage of the battery detected by the detecting process; and determining a battery condition based on the battery voltage.

According to another aspect of the invention, there is provided a battery condition detecting method which comprises the steps of: setting a current required during standard discharge of a battery as a set current; sampling current and voltage of the battery at preselected intervals for a given period of time during which no variation in battery capacity is considered to have occurred; determining battery voltages when the battery discharges the set current based on sample pairs of parameters indicative of the current and voltage of the battery sampled for the given period of time; producing an estimated battery voltage based on the battery voltage of highest frequency or an average value of the battery voltages; and determining a battery condition based on the estimated battery voltage.

According to a further aspect of the invention, there is provided a battery condition detecting method which comprises the steps of: setting a current required during standard discharge of a battery as a set current; sampling a given number of pairs of parameters indicative of current and voltage of the battery during discharge within a period of time during which a variation in capacity due to the discharge lies within a range of 0.1 to 10% of a rated capacity of the battery; selecting ones, from the sampled pairs of parameters indicative of the current and voltage of the battery, which satisfy a given-time rate current; determining an internal resistance of the battery based on the selected sampled pairs; projecting a battery voltage when the battery discharges the set current based on the internal resistance of the battery; and determining a battery condition based on the projected battery voltage.

According to a further aspect of the invention, there is provided a battery condition detecting method which comprises the steps of: setting a current required during standard discharge of a battery as a set current; measuring the amount of charge to the battery and the amount of discharge from the battery; detecting a discharge current and a battery voltage of the battery when the amount of discharge after charge to the battery exceeds the amount of projected battery voltage when the battery discharges the set current based on the discharge current and the battery voltage; and determining a battery condition based on the projected battery voltage.

According to a further aspect of the invention, there is provided a battery condition detecting method which comprises the steps of: setting a current required during standard discharge of a battery as a set current; determining a battery voltage when the battery discharges the set current based on a discharge current and a voltage of the battery; defining battery charge index numbers assuming that 100 represents a time immediately after the battery discharges from a fully charged level and 0 represents a time when unserviceable battery voltage is reached; and determining a battery charge index number based on the battery voltage determined by the battery voltage determining step.

According to a further aspect of the invention, there is provided a battery condition detecting method for detecting a charged condition of a battery based on a relation between discharge current and discharge voltage, which comprises the steps of: sampling pairs of parameters indicative of current flowing into or out of the battery and the voltage of the battery at given intervals and storing them; determining whether a charge operation of the battery is initiated or not based on a direction of the currents sampled; determining whether charge polarization of the battery is eliminated or not; determining a variation in battery capacity based on a change in the currents sampled and storing it; determining whether the variation in battery capacity exceeds a given percent of a rated capacity of the battery or not; selecting from the pairs of parameters indicative of the current and the voltage sampled until the variation in battery capacity exceeds the given percent of the rated capacity, ones having the currents greater than a given time rate current, and determining an internal resistance of the battery based on the selected pairs of parameters; determining voltage parameters indicative of battery voltage Vs during discharge at a preselected current based on the sampled pairs of parameters indicative of the current and the voltage using the internal resistance of the battery; determining whether a given number of the voltage parameters indicative of the battery voltages Vs are derived within a predetermined period of time or not; removing parameters of lower frequency from the voltage parameters indicative of the battery voltages Vs of the given number using given statistical processing to estimate an actual battery voltage; and determining a battery condition based on the estimated actual battery voltage.

According to a further aspect of the invention, there is provided a battery condition detecting method which comprises the steps of: determining a correction value based on an average discharged current of currents discharged from a battery for a given period of time which is set greater than a time interval required for discharge polarization of the battery to be brought into a steady state; multiplying a fully charged capacity of the battery by the correction value to determine an available discharge capacity; and subtracting a consumption of electric power of the battery from the available discharge capacity to determine an available reserve capacity remaining in the battery.

In the preferred mode of the invention, the correction value is determined based on a battery temperature and the average discharged current.

According to a further aspect of the invention, there is provided a battery condition detecting method which comprises the steps of: sampling current and temperature of a battery at given intervals; determining an average discharged current of the currents sampled for a given period of time to determine a correction value α based on the average discharged current and the temperature of the battery; determining whether the battery is in charge operation or discharge operation based on a direction of the currents sampled; determining the amount of discharge Qd of the battery when the battery is determined to be in the discharge operation by integrating the currents sampled during the discharge; determining the amount of charge Qc of the battery when the battery is determined to be in the charge operation by integrating the currents sampled during the charge; determining the consumption amount of electric power Qs of the battery based on the amount of discharge Qd and the amount of charge Qc; multiplying a predetermined fully charged capacity of the battery by the correction value α to determine an available discharge capacity; and subtracting the consumption amount of electric power Qs from the available discharge capacity to determine an available reserve capacity remaining in the battery.

BRIEF DESCRIPTION OF THE DRAWINGS

The present invention will be understood more fully from the detailed description given hereinbelow and from the accompanying drawings of the preferred embodiment of the invention, which, however, should not be taken to limit the invention to the specific embodiment but are for explanation and understanding only.

In the drawings.

DESCRIPTION OF THE PREFERRED EMBODIMENT

Figure 1:
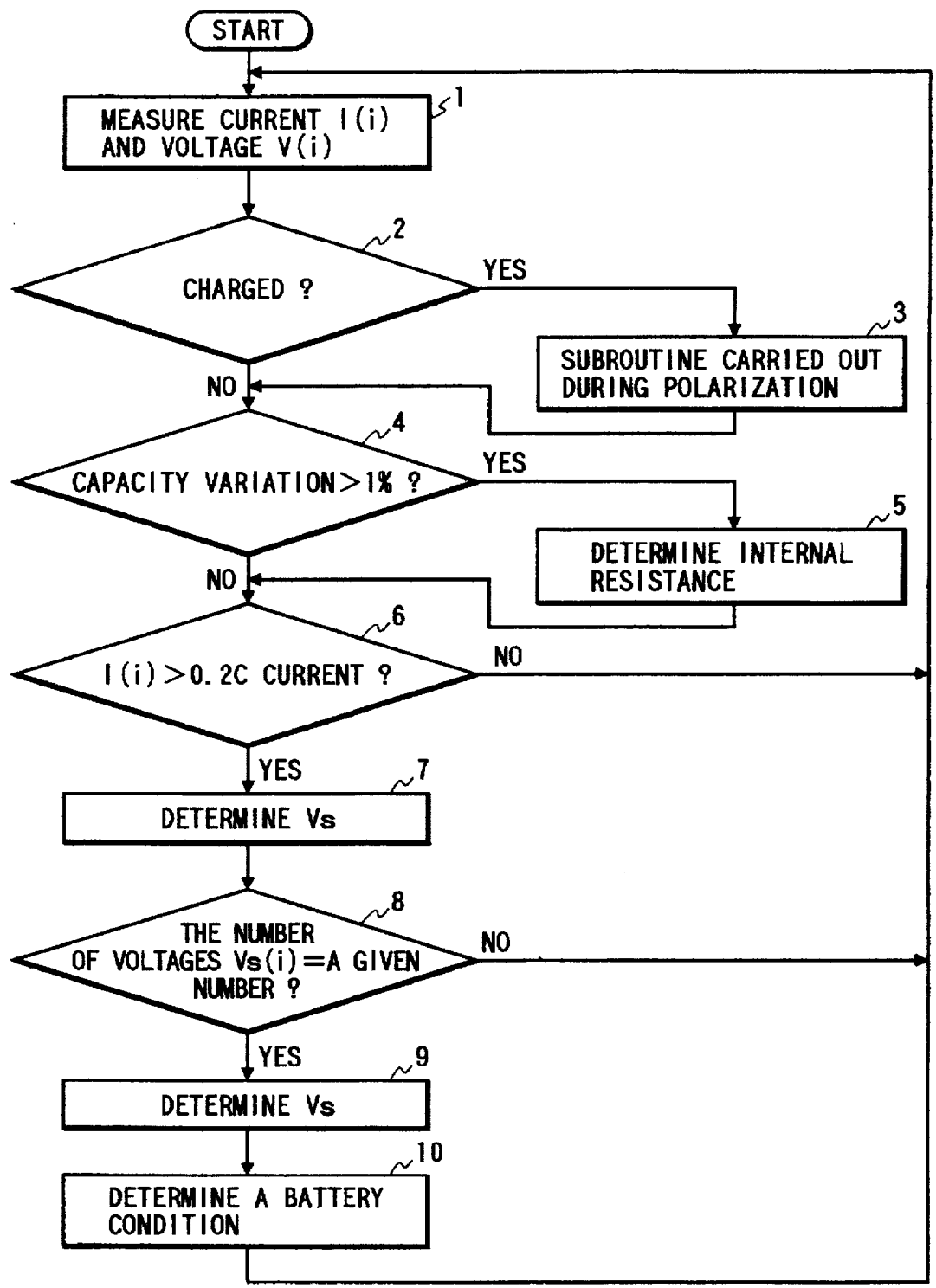
FIG. 1 is a flowchart of a program or sequence of logical steps performed for determining a battery condition according to the present invention.

Referring now to the drawings, particularly to FIG. 1, there is shown a flowchart of a program or sequence of logical steps performed by a computer system for determining the amount of available reserve electrical power remaining in a storage battery installed in an electric automobile. This program is carried out every program cycle, for example 0.2 sec.

After entering the program, the routine proceeds to step 1 wherein the current flowing between the battery and an electric driving motor of the automobile and the voltage then appearing between positive and negative terminals of the battery are measured.

The routine then proceeds to step 2 wherein it is determined whether a battery charging operation has been started or not based on a sign, or flow direction of the current measured. If a YES answer is obtained meaning that the battery charging operation has been initiated, then the routine proceeds to step 3 wherein given measures are taken against charge polarization of the battery. The routine is inhibited from proceeding to a subsequent step until the charge polarization is cured completely. This compensates for an increase in battery voltage due to the charge polarization.

Figure 6:
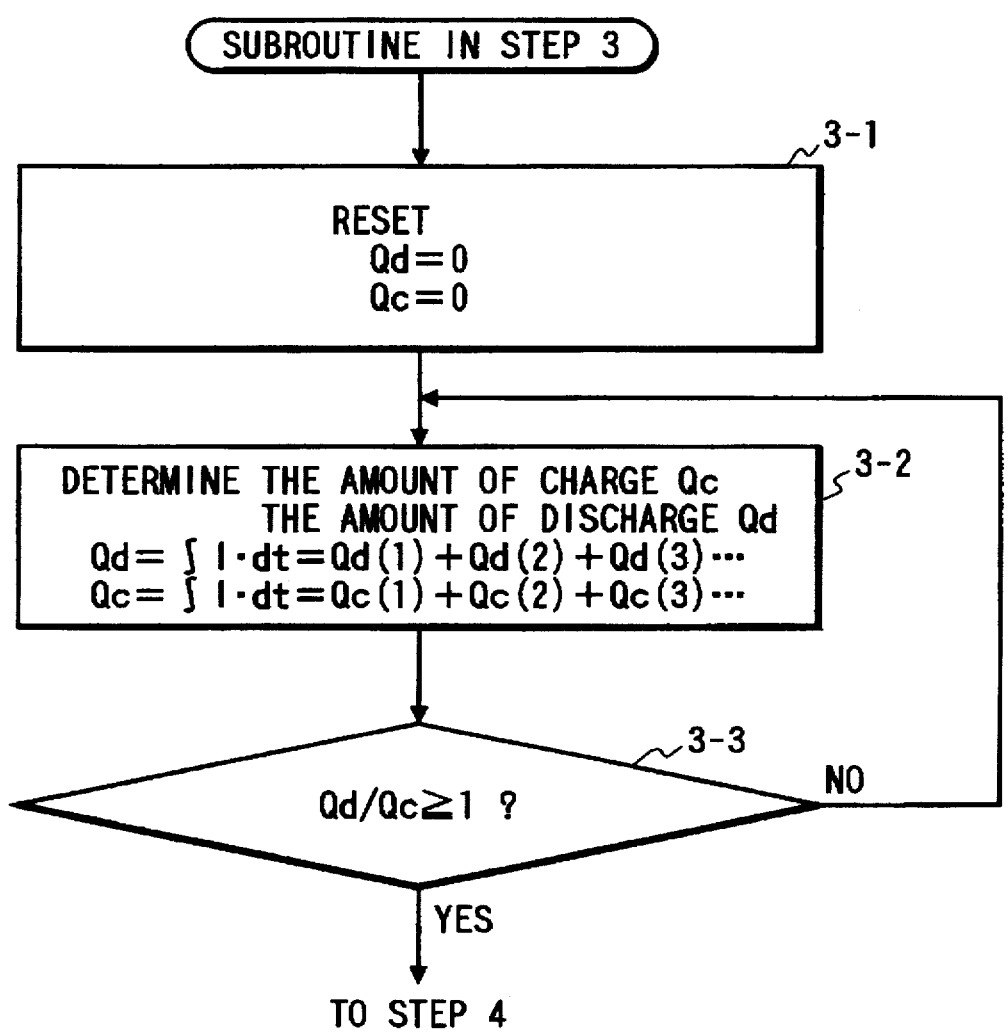
FIG. 6 is a subroutine performed in step 3 of the flowchart shown in FIG. 1.

FIG. 6 shows a subroutine carried out in step 3.

Figure 7:
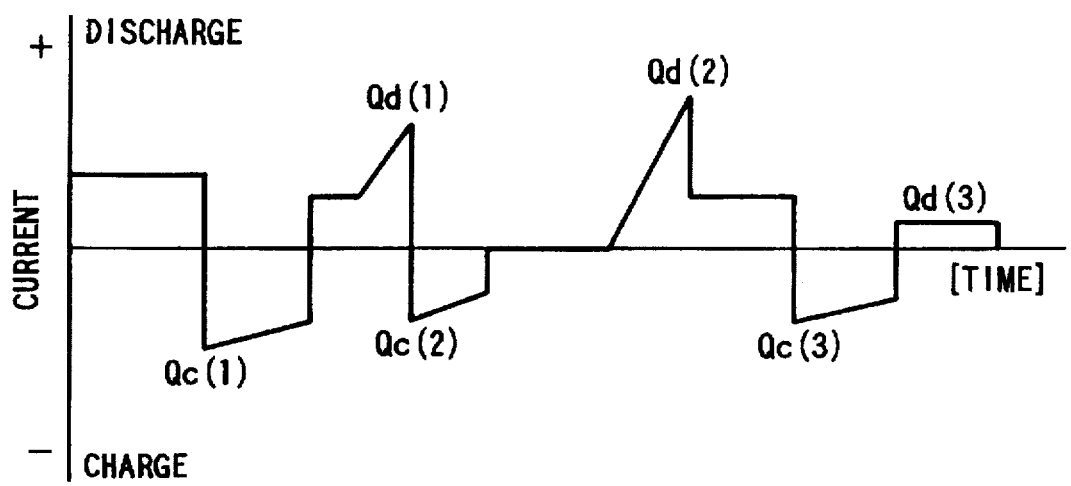
FIG. 7 is a time chart which shows a charge pattern of a battery.
Figure 8:
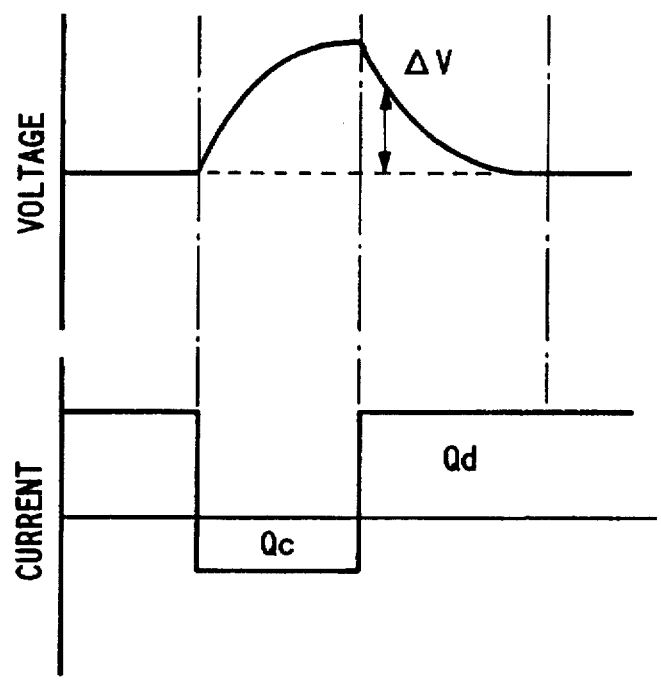
FIG. 8 shows a voltage variation during recharge of a battery and a variation in discharge voltage after the recharge.
Figure 9:
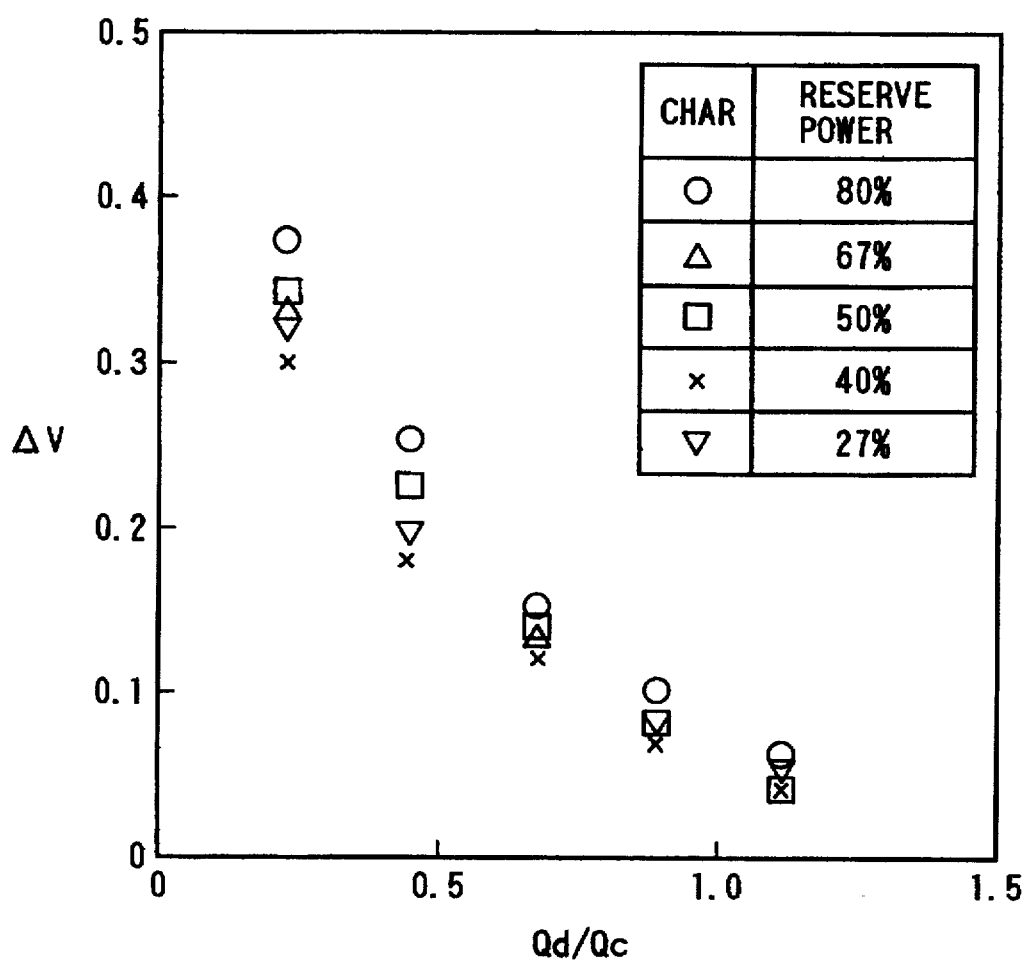
FIG. 9 is a graph which shows a relation between a detection voltage error and a ratio of the amount of discharge Qd to the amount of charge Qc.

In step 3-1, immediately after the electric driving motor of the electric automobile starts to recharge the battery, parameters indicative of the quantity of battery charge Qc and the quantity of battery discharge Qd are reset to zero, respectively. Subsequently in step 3-2, the quantity of battery charge Qc and the quantity of battery discharge Qd are as shown in FIG. 7, determined by integrating a charge dcurrent and a discharged current, respectively, from the time the parameters Qc and Qd are reset. The routine then proceeds to step 3—3 wherein it is determined whether a charge polarization termination condition Qd/Qc≧1 is satisfied or not. This determination is made for determining if the amount of battery discharge is greater than the amount of regenerative battery charge provided by the driving motor during braking of the automobile before that discharge. Usually, once a battery is charged, its voltage, as shown in FIG. 8, becomes high due to the charge polarization for some time following the initiation of battery discharging. FIG. 9 shows that the increase in voltage ΔV continues substantially until a ratio of Qd to Qc reaches 1.0. It will be, thus, appreciated that a battery voltage detected before the Qd/Qc ratio reaches 1.0 does not show a proper battery condition. Therefore, in step 3, if this condition is not encountered, the routine is inhibited from going to a subsequent step.

If the Qd/Qc ratio has reached 1.0 in step 3, then the routine proceeds to step 4.

The battery capacity is usually expressed in ampere-hours (AH). For example, when a storage battery having a rated capacity of 100 AH discharges 30 amperes (A) for one hour, a discharged capacity will be 30 AH. A variation in battery capacity caused by the discharge can be determined by detecting current flowing from the battery every given detection cycle (in this embodiment, 0.2 sec.).

For example, assuming that a current detected in a first detection cycle shows 30A and a current detected in a second detection cycle 0.2 sec. after the first detection cycle shows 100A, it is found that a capacity of 30A×0.2 sec.+100A×0.2 sec. has been changed, or consumed. In this manner, step 4 derives a battery capacity variation based on discharged current values obtained in the past detection cycles in step 1, and determine whether it exceeds one (1) percent of a rated capacity of the battery or not.

The reason for determining if the battery capacity variation exceeds one (1) percent of the rated capacity is that current and voltage data derived in step 1 before a variation in battery capacity in excess of a certain value takes place, will incur errors in detecting an internal resistance in a subsequent step 5. Additionally, if the battery capacity variation is too great, the amount of the current and voltage data may be great. This, however, undesirably consumes a long period of time until it becomes possible to detect a battery condition after the electric automobile starts.

In step 4, a value of the current derived in step 1 is stored in a memory as a capacity variation parameter, and it is determined if the battery capacity variation derived in the above described manner is, as already mentioned, greater than one (1) percent of the rated capacity of the battery. In practice, a discharge capacity is mathematically derived by totaling a given number of products of discharge current× time, and it is determined whether a ratio of the discharge capacity/the rated capacity is greater than one (1) percent of the rated capacity or not. This criterion may alternatively be a value within a range form 0.1 to 10 percent, preferably, within a range from 0.5 to 5 percent of the rated capacity.

Figure 10:
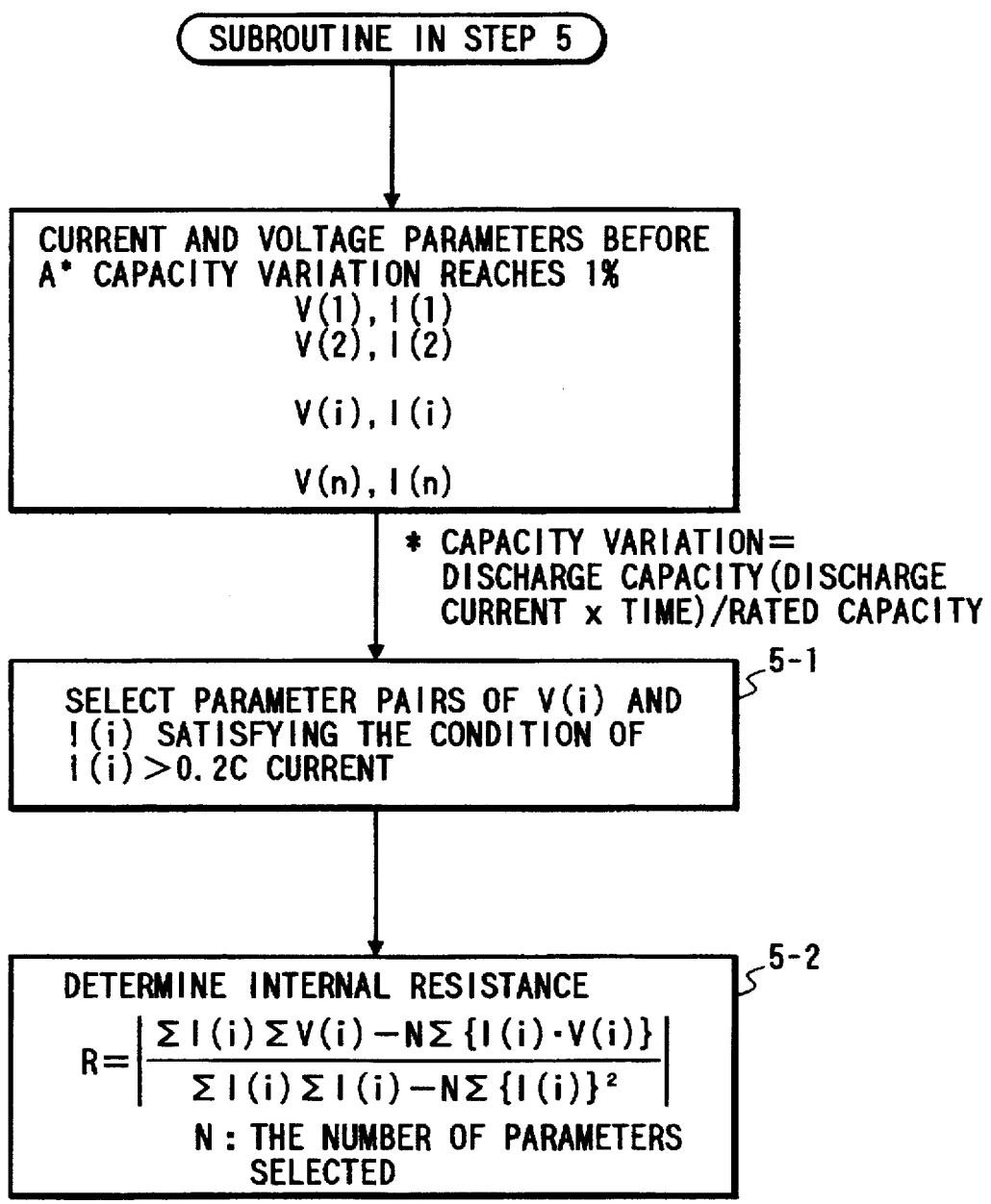
FIG. 10 is a subroutine carried out in step 5 in the flowchart shown in FIG. 1.

FIG. 10 shows a subroutine carried out in step 5 for determining an internal resistance of the battery.

In step 5-1, in order to eliminate parameters in a range where an slope of the V-I characteristic has no linearity, only parameter pairs of current I and voltage V wherein the current exceeds a 0.2C current value, are extracted from a plurality of parameter pairs of current I(i) and voltage V(i) sampled in step 1 until the battery capacity variation reaches 1% in step 4 and stored in the memory. It is advisable that the number of sampled parameters pairs of I(i) and V(i) be great. In this embodiment, these parameter pairs are, as discussed above, sampled every 0.2 sec. This sampling cycle may alternatively be within a range from 10 to 0.1 sec.

Note that the letter "C" of the 0.2C current value, as described above, indicates a rated capacity. For example, when a rated capacity of the battery is 100AH, the 0.2C current value will be 0.2×100=20 amperes. This is also referred to as 5-time rate current derived by dividing the rated capacity (AH) by five (5).

As discussed above, it is necessary to determine the internal resistance of the battery based on the parameter pairs of current I(i) and voltage V(i) sampled when the battery discharges a current greater than a certain level for compensating for errors incurred to determining the internal resistance. Step 5 is provided for removing parameters in the range where an slope of the V-I characteristic has no linearity to calculate a correct internal resistance of the battery.

In step 5-2, using the method of least squares, the slope of the V-I characteristic, or the internal resistance is determined based on the parameter pairs of I(i) and V(i) selected in step 5-1.

Figure 11:
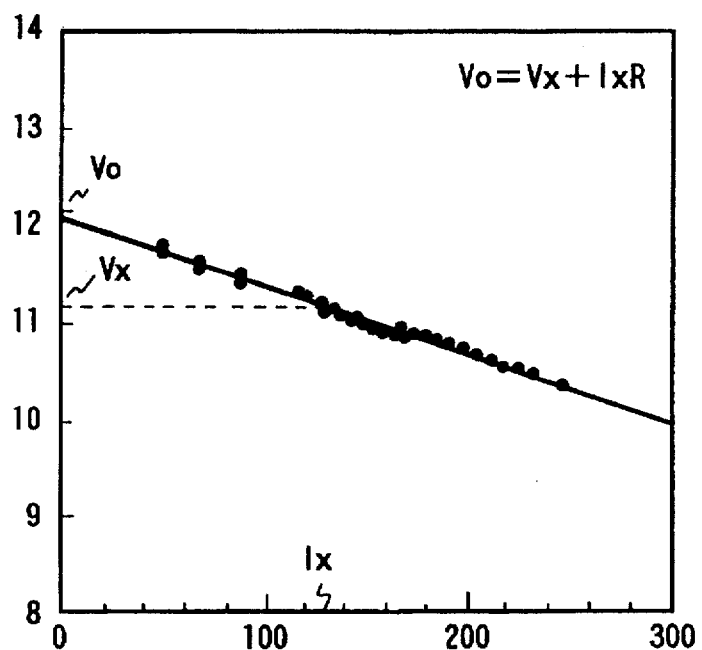
FIG. 11 is a graph which shows V-I characteristics of voltage and current parameters sampled for a given period time.

FIG. 11 shows an internal resistance of the battery when it has been charged or discharged in a pattern simulating traveling of an electric automobile in 15 modes. The V-I characteristic has the linearity meaning that it is possible to find a correct internal resistance (i.e., an slope of the V-I characteristic).

Referring back to FIG. 1, after step 5, the routine proceeds to step 6 wherein it is determined whether the current I(i) is higher than the 0.2C current value or not. This determination is provided for determining whether or not a pair of parameters I(i) and V(i) derived in step 1 in this program cycle is within a range defining the straight line of the V-I characteristic shown in FIG. 11.

If a YES answer is obtained, then the routine proceeds to step 7 wherein a battery voltage Vs(i) during discharge at current is (e.g., 1C) required to activate the electric motor for producing a standard degree of acceleration, is projected according to the equation (1), as shown below, based on the current I(i) and the voltage V(i) derived in step 1, and stored in the memory. The battery voltage Vs depends upon an available reserve electric power, or capacity remaining in the battery. When the battery voltage Vs assumes a great value, it shows that the remaining capacity of the battery is great.

$$Vs(i) = V(i) + (I(i) - Is)R \tag{1}$$

The above equation (1) is obtained in the following manner. The straight line of the V-I characteristic shown in FIG. 11 may be expressed by $$Vo = V(i) + I(i) \cdot R \tag{2}$$

where Vo is an apparent open circuit voltage and R is an internal resistance. Usually, when the current supplied by a battery becomes small, actual battery characteristics become impossible to be expressed by the equation of Vo=V(i)+I(i)·R and an actual voltage of the battery when open-circuited becomes higher than the apparent open circuit voltage Vo. In this embodiment, Vo is a value that satisfies I(i)=0 in the relation of Vo=V(i)+I(i)·R.

The voltage Vs(i) during discharge at the current Is may be given by the following relation.

$$Vs(i)=Vo-Is \cdot R \quad (3)$$

Thus, from the equations (2) and (3), the equation (1) is derived.

Figure 2:
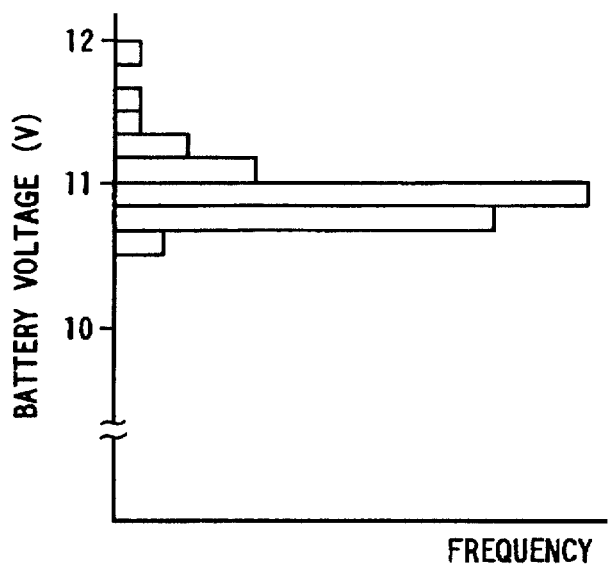
FIG. 2 is a graph which shows frequency distribution of battery voltage parameters measured.
Figure 3A:
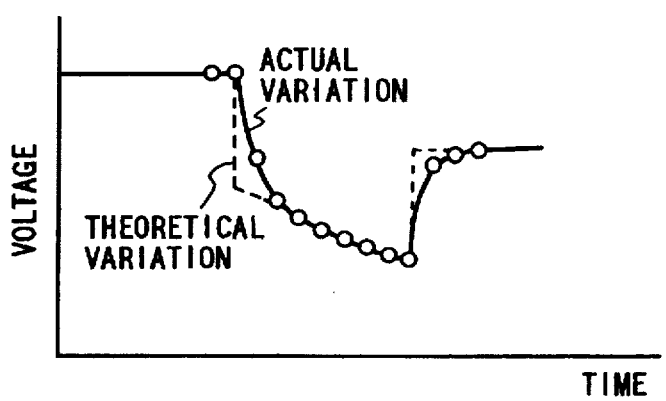
FIGS. 3(a) and 3(b) show variations in battery voltage and current with respect to time.
Figure 3B:
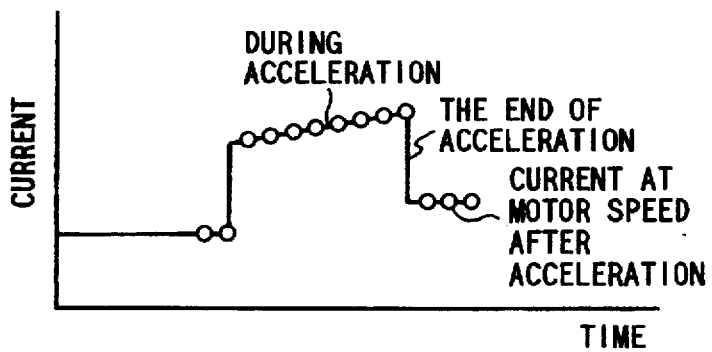
Figure 4:
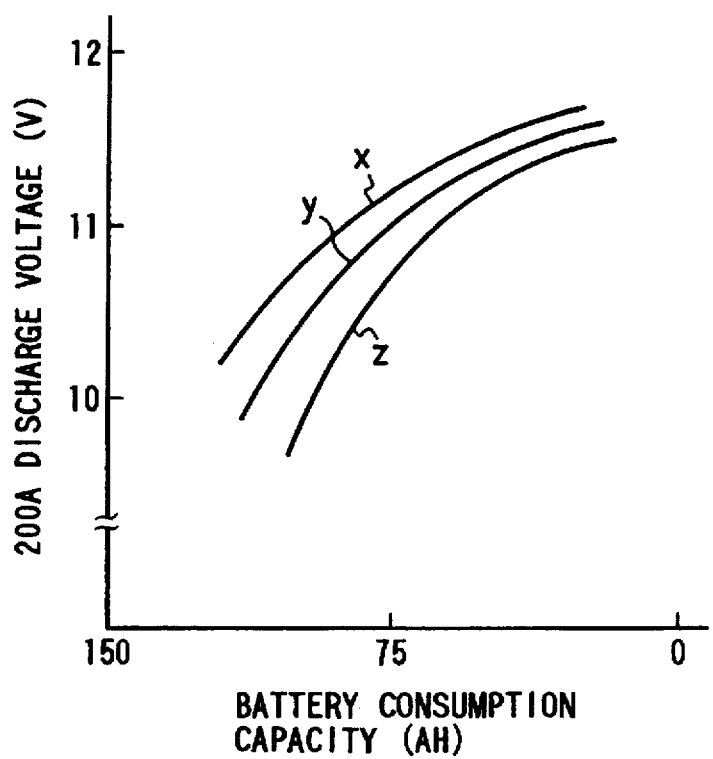
FIG. 4 is a graph which shows a relation between a battery consumption and discharge voltage during discharge at 200A.
Figure 5:
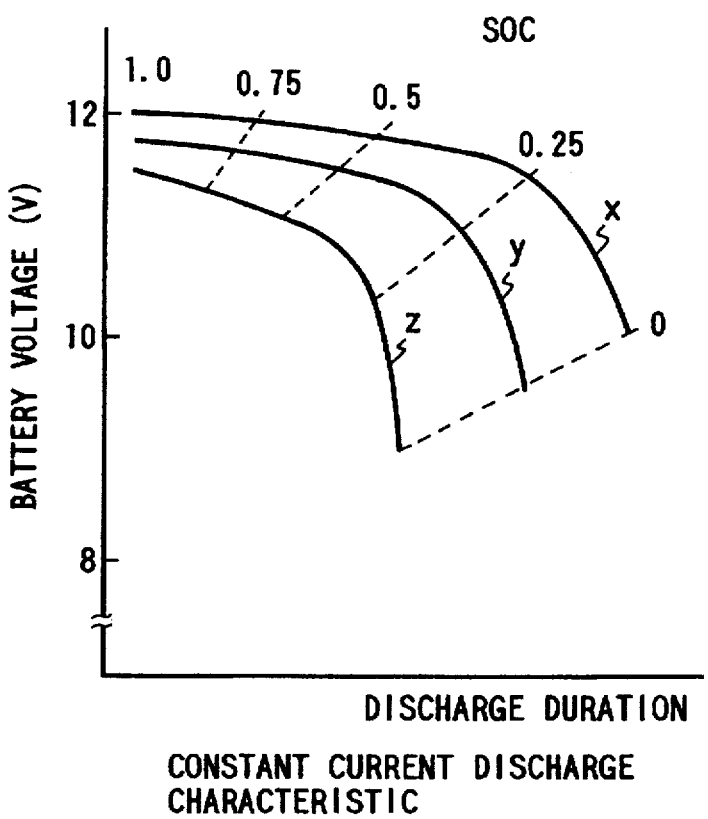
FIG. 5 is a graph which shows a relation between a battery voltage and a discharge duration.

After the battery voltage Vs(i) is determined in step 7, the routine proceeds to step 8 wherein to derive an actual battery voltage Vs, it is determined whether the number of parameters of the battery voltage Vs(i) derived so far reaches a given number or not. It is necessary to collect the given number of parameters of the battery voltage Vs(i) within a short period of time enough to neglect the variation in battery capacity. In this embodiment, the given number is set to twenty-five (25). Thus, since the program cycle, or execution cycle of step 1 is, as mentioned above, 0.2 sec., the given number of 25 is reached in five (5) seconds. The execution cycle of step 1 may alternatively be 0.1 sec. to have fifty (50) parameters of the battery voltage Vs(i). FIG. 2 shows battery voltage parameters derived in 50 execution cycles of step 1. Of these battery voltage parameters, ones derived based on current and voltage in a steady state of the battery show substantially the same value (11V in FIG. 2), and the frequency thereof is highest, while the frequency of battery voltage parameters being derived based on current and voltage in a transient state of the battery is low.

In step 9, the actual voltage Vs during discharge at a given current (e.g., one-time rate discharge) is estimated to be a battery voltage of 11V of highest frequency. The actual voltage Vs may alternatively be determined by averaging the battery voltage. parameters derived so far.

Figure 12:
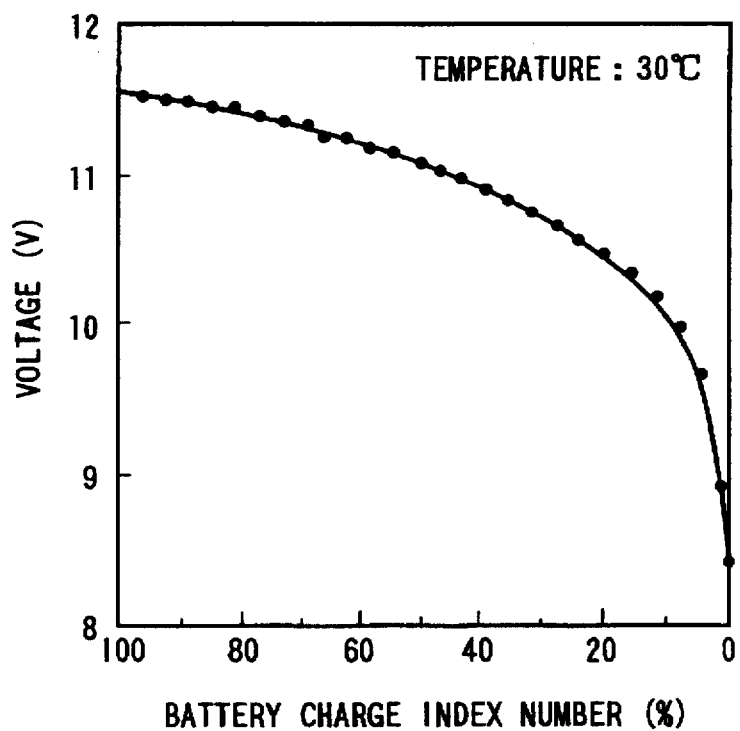
FIG. 12 is a graph which shows a relation between a battery discharge index number and a battery voltage.

In step 10, a battery charge index number SOC is determined based on the estimated voltage Vs. The index number SOC is expressed in percentage of a discharge time assuming that a time immediately after the battery starts to discharge the set current Is from a fully charged state is defined as 100 and a time at which the battery becomes unserviceable to drive the electric automobile, is defined as 0. In practice, the battery charge index number SOC is determined based on the estimated voltage Vs by look-up using mapped data, as shown in FIG. 12, in terms of battery charge index number and discharge voltage. The battery charge index number SOC is used to determine a time when the battery should be charged.

Figure 13:
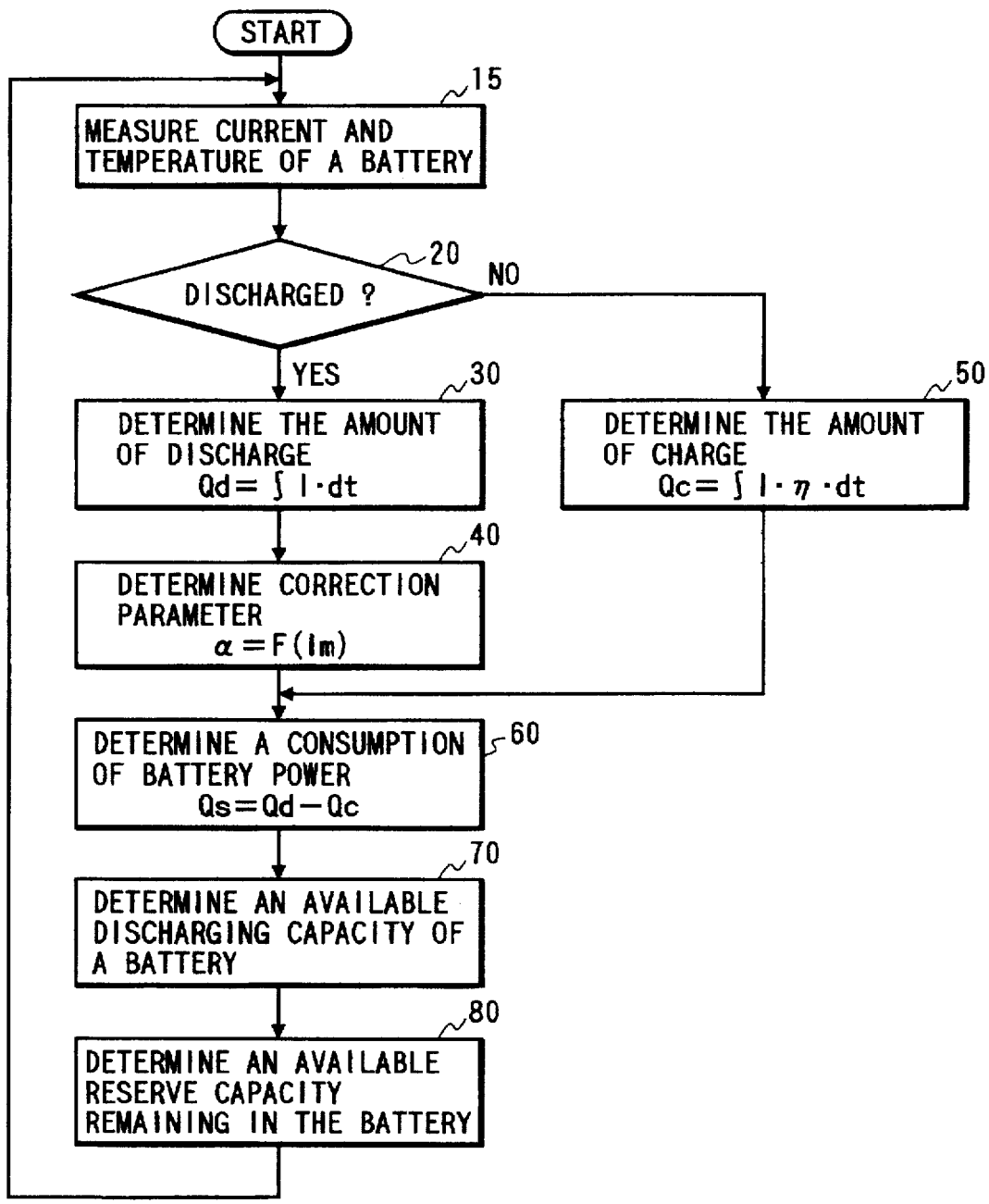
FIG. 13 is a flowchart for determining a battery condition according to an alternative embodiment of the invention.

Referring to FIG. 13, there is shown an alternative embodiment of the present invention.

In step 15, the current and temperature of the battery are sampled at preselected time intervals. In step 20, it is determined whether the battery is being charged or discharged based on a current flow direction. If it is concluded that the battery is in a discharge state, then the routine goes to step 30 wherein current values or parameters derived so far in step 15 are integrated to determine the quantity of battery discharge Qd according to the relation of Qd=∫I·dt. Alternatively, if it is concluded in step 20 that the battery is in a charge state, then the routine proceeds to step 50 wherein the current parameters derived so far in step 15 are integrated to derive the quantity of battery charge Qc according to the relation of Qc=∫i·η·dt where η is a charging efficiency.

In step 4, an average value Im of current discharged for a given period of time (e.g., five minutes) prior to this program cycle, is determined so as to calculate a correction parameter α. This given period of time is determined in the following manner.

A variation in available discharge capacity dependent upon the magnitude of discharge current is caused by a change in discharge polarization of the battery. This discharge polarization bears relation with the thickness of battery electrolyte diffusion layers determined by the pore size or porosity of electrode plate. The relation between the thickness σ of the battery electrolyte diffusion layer and a time t required for a polarization phenomenon to be changed into a steady state may be expressed by the following equation.

$$t=\pi\sigma/4D$$

where D is a diffusion parameter.

A condition of the discharge polarization during traveling of the electric automobile is, thus, determined accurately by finding an average discharge current for the past time t.

For example, a typical lead-acid storage battery has diffusion layers of approximately 200 μm thickness, and the time t will be 200 sec. In this embodiment, a margin of 100 sec. is added to derive the time t of five (5) minutes.

Figure 14:
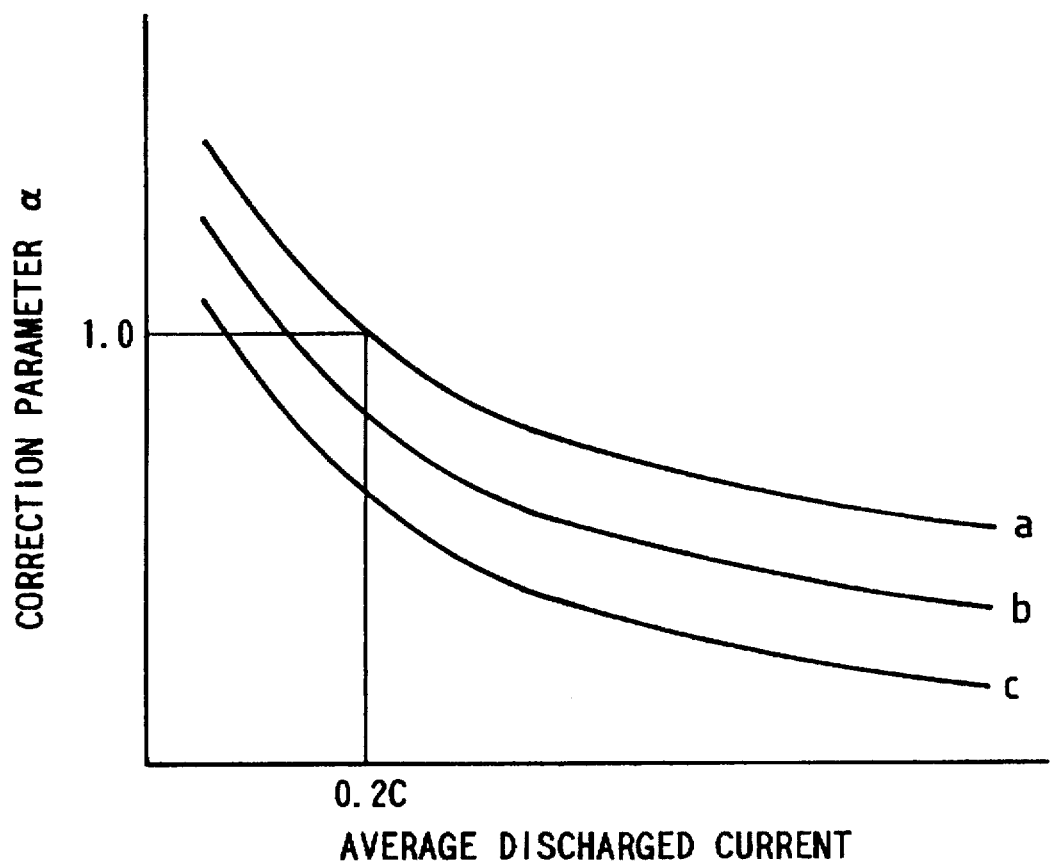
FIG. 14 is a graph which shows a relation between a correction parameter and an average discharged current.

The correction parameter α for the average discharged current Im is determined by look-up using mapped data shown in FIG. 14. According to a battery temperature (a>b>c), one of three curves a, b, and c is selected. For example, when the battery shows a temperature of a, and the average discharged current Im is 0.2C. 1.0 is provided as the correction parameter α.

The average discharged current Im is calculated based on current values obtained only during discharge and excluding current value when the battery is not in use and during charge. The reason for this is that the addition of current values other than those derived only during charge results in a considerably decreased level of the average discharged current Im which is greatly different from a current value while the electric automobile travels.

Referring back to the flowchart, after the correction parameter α is found the routine proceeds to step 60 wherein a power consumption Qs of the battery is determined according to the following equation.

$$Qs=Qd-Qc$$

where Qd is the quantity of battery discharge Qd determined in step 30 and Qc is the quantity of battery charge determined in step 50.

In step 70, a fully charged capacity of the battery is multiplied by the correction parameter α to determine an available discharging capacity. Note that the fully charged capacity depends on types of batteries, and is restored in the program.

Subsequently, in step 80, the power consumption Qs is subtracted from the available discharging capacity to determine an available reserve capacity remaining in the battery.

As apparent from the above discussion, this embodiment updates the correction parameter α in a function of the average discharged current Im in the past 5 minutes. Thus, even if a considerable increase in discharged current has taken place due to a variation in discharging pattern during traveling of the automobile or a voltage drop developed at the end of discharge, a correct reserve power remaining in the battery is derived quickly and correctly.

While the present invention has been disclosed in terms of the preferred embodiment in order to facilitate a better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A battery condition detecting method comprising the steps of:
   determining a correction value based on an average discharged current of currents discharged from a battery for a given period of time which is set greater than a time interval required for discharge polarization of the battery to be brought into a steady state;
   multiplying a fully charged capacity of the battery by the correction value to determine an available discharge capacity; and
   subtracting a consumption of electric power of the battery from the available discharge capacity to determine an available reserve capacity remaining in the battery.

2. A battery condition detecting method as set forth in claim 1, wherein the correction value is determined based on a battery temperature and the average discharged current.

3. A battery condition detecting method as set forth in claim 1, wherein the time interval t required for discharge polarization of the battery to be brought into the steady state is given by the following equation:

$$t = \pi\sigma/4D$$

where $\sigma$ is the thickness of electrolyte diffusion layers of the battery, and D is a given diffusion parameter.

4. A battery condition detecting method comprising the steps of:
   sampling current and temperature of a battery at given intervals;
   determining an average discharged current of the currents sampled for a given period of time to determine a correction value $\alpha$ based on the average discharged current and the temperature of the battery, the given period of time being greater than a time interval required for discharge polarization of the battery to be brought into a steady state;
   determining whether the battery is in a charge operation or a discharge operation based on a direction of the currents sampled;
   determining the amount of discharge Qd of the battery when the battery is determined to be in the discharge operation by integrating the currents sampled during the discharge;
   determining the amount of charge Qc of the battery when the battery is determined to be in the charge operation by integrating the currents sampled during the charge;
   determining the consumption amount of electric power Qs of the battery based on the amount of discharge Qd and the amount of charge Qc;
   multiplying a predetermined fully charged capacity of the battery by the correction value $\alpha$ to determine an available discharge capacity; and
   subtracting the consumption amount of electric power Qs from the available discharge capacity to determine an available reserve capacity remaining in the battery.

5. A battery condition detecting method as set forth in claim 4, wherein the time interval t required for discharge polarization of the battery to be brought into the steady state is given by the following equation:

$$t = \pi\sigma/4D$$

where $\sigma$ is the thickness of electrolyte diffusion layers of the battery, and D is a given diffusion parameter.

6. A battery condition detecting method comprising the steps of:
   determining a correction value base don an average discharged current of currents discharged from a battery for a given period of time, the given period of time being greater than a time interval required for discharge polarization of the battery to be brought into a steady state, the average discharged current being determined using currents discharged from the battery and excluding battery currents flowing when the battery is not in use and when the battery is being charged;
   multiplying a fully charged capacity of the battery by the correction value to determine an available discharge capacity; and
   subtracting a consumption of electric power of the battery from the available discharge capacity to determine an available reserve capacity remaining in the battery.

7. A battery condition detecting method as set forth in claim 6, wherein the time interval t required for discharge polarization of the battery to be brought into the steady state is given by the following equation:

$$t = \pi\sigma/4D$$

where $\sigma$ is the thickness of electrolyte diffusion layers of the battery, and D is a given diffusion parameter.

8. A battery condition detecting method comprising the steps of:
   sampling current and temperature of a battery at given intervals;
   determining an average discharged current of battery currents sampled for a given period of time so as to determine a correction value $\alpha$ based on the average discharged current and the temperature of the battery, the average discharged current being determined using currents discharged from the battery and excluding battery currents sampled when the battery is not in use and when the battery is being charged.
   determining whether the battery is in a charge operation or a discharge operation based on a direction of the battery currents sampled;
   determining the amount of discharge Qd of the battery when the battery is determined to be in the discharge operation by integrating the currents sampled during the discharge operation;
   determining the amount of charge Qc of the battery when the battery is determined to be in the charge operation by integrating the currents sampled during the charge operation;
   determining the consumption amount of electric power Qs of the battery based on the amount of discharge Qd and the amount of charge Qc;
   multiplying a predetermined fully charged capacity of the battery by the correction value $\alpha$ to determine an available discharge capacity; and subtracting the consumption amount of electric power Qs from the available discharge capacity to determine an available reserve capacity remaining in the battery.

9. A battery condition method as set forth in claim 8, wherein the given period of time during which the currents are sampled is greater than or equal to a time interval t required for discharge polarization of the battery to be brought into a steady state, which is given by the following equation:

$$t = \pi \sigma / 4D$$

where $\sigma$ is the thickness of electrolyte diffusion layers of the battery, and D is a given diffusion parameter.

* * * * *